United States Patent [19]
Kukimoto

[11] Patent Number: 5,387,830
[45] Date of Patent: Feb. 7, 1995

[54] SEMICONDUCTOR DEVICE WITH EXCESS CURRENT PREVENTION CIRCUIT

[75] Inventor: Yoshihiro Kukimoto, Tokyo, Japan

[73] Assignee: NEC Corporation, Tokyo, Japan

[21] Appl. No.: 957,797

[22] Filed: Oct. 8, 1992

[30] Foreign Application Priority Data

Oct. 8, 1991 [JP] Japan .................................. 3-259969

[51] Int. Cl.⁶ ..................... H03K 17/04; H03K 17/687
[52] U.S. Cl. .................................. 327/322; 327/328; 327/543
[58] Field of Search ............... 307/544, 546, 548, 550, 307/568, 572, 584

*Primary Examiner*—Willis R. Wolfe
*Attorney, Agent, or Firm*—Sughrue, Mion, Zinn, Macpeak & Seas

[57] ABSTRACT

A semiconductor device with an excess current prevention circuit includes a bootstrap circuit, a first NMOS transistor, a second NMOS transistor and a constant voltage element. The first NMOS transistor has a drain electrode to receive a power supply potential, a gate electrode to receive an output of the bootstrap circuit, and a source electrode connected to an output terminal to which an output load is connected. The second NMOS transistor has a gate electrode whose potential is held at the power supply potential and a source electrode connected to-the output terminal. The constant-voltage element such as a diode or a Zener diode is connected between the gate electrode of the first NMOS transistor and the drain electrode of the second NMOS transistor. A change in the output voltage of the first NMOS transistor as an output transistor is fed-back to the gate electrode of the first N-channel MOS transistor by the second N-channel MOS transistor, whereby the operation of preventing the excess current is carried out at a high speed.

3 Claims, 3 Drawing Sheets

SEMICONDUCTOR DEVICE WITH EXCESS CURRENT PREVENTION CIRCUIT

BACKGROUND OF THE INVENTION

1. Field of the Invention

The present invention relates to a semiconductor device, and more particularly to an excess current or overcurrent prevention circuit having a quick response speed for use in an output circuit in which an N-channel insulated-gate field effect transistor (hereinafter simply referred to as "NMOS transistor") is used as an output transistor and also a bootstrap circuit is used.

2. Description of the Related Art

First, a conventional semiconductor circuit device of the kind to which the present invention relates is explained with reference to FIG. 1. As shown therein, the circuit device comprises an output circuit formed by a first NMOS transistor 1, an output terminal 6 and an output load 5, and a feedback circuit formed by an output resistor 8, a current detection circuit 9, a control circuit 10 and a bootstrap circuit 4. More specifically, the first NMOS transistor 1 has its drain electrode D connected to a power supply terminal $V_{DD}$, its source electrode S connected to one end of the output resistor 8 the other end of which is connected to the output terminal 6, and its gate electrode G is connected to an output node of the bootstrap circuit 4.

Now, an explanation is given on the operation of the above semiconductor circuit device shown in FIG. 1.

The current detection circuit 9 performs the current detection by utilizing a potential difference appearing across the output resistor 8 when the current flows from the first NMOS transistor 1 to the output terminal 6. The current thus detected is fed-back to the control circuit 10, thereby controlling the gate voltage of the first NMOS transistor 1 which is the output transistor.

For example, while the first NMOS transistor 1 is in a non-conductive state, the output current does not flow so that no potential difference develops across the output resistor 8. On the other hand, while the same first NMOS transistor 1 is in a conductive state, the output current does flow and, thus, the potential difference develops across the output resistor 8. When this potential difference across the output resistor 8 rises above a predetermined voltage which has been pre-established in the current detection circuit 9, an output level of a comparator within the current detection circuit 9 is inverted and the resulting inverted signal is forwarded to the control circuit 10. Upon receiving this inverted signal, the control circuit 10 operates to cause the driving voltage of the bootstrap circuit 4 to be lowered, whereby the gate potential of the first NMOS transistor 1 is in turn lowered and the channel-current controlling thereof is performed.

FIG. 2 shows waveforms of the current which flows in the first N-channel MOS transistor 1 in the case where an output short-circuiting occurs at point X.

In the conventional semiconductor circuit device described above, since the gate voltage of the first NMOS transistor 1 is controlled by the control circuit 10 and the bootstrap circuit 4 after the detection of an excess current, a response speed is low so that, in case the output terminal 6 is unintentionally grounded (the output short-circuiting), the excess current continues to flow in the first N-channel MOS transistor 1 and the output resistor 8 until the abovementioned control is completed. This is a problem as it may lead to the breakdown of elements concerned. In addition, since a resistor element (the output resistor 8) is connected in series with respect to the output NMOS transistor 1, there has been a problem in allowing a large current to flow therethrough in the normal use. These are problems to be solved by the present invention, in the conventional semiconductor circuit device.

SUMMARY OF THE INVENTION

It is, therefore, an object of the invention to overcome the problems existing in the conventional semiconductor circuit device, and to provide an improved circuit device which is capable of effecting a high speed control of the current which, when in excess, flows in the output N-channel MOS transistor.

According to one aspect of the present invention, there is provided a semiconductor circuit device with an excess current prevention circuit comprising:

a bootstrap circuit;

a first NMOS transistor having a drain electrode connected to a power supply terminal, a gate electrode connected to an output of the bootstrap circuit, and a source electrode connected to an output terminal;

a second NMOS transistor having a gate electrode connected to the power supply terminal and a source electrode connected to the output terminal; and a constant-voltage element connected between the gate electrode of the first NMOS transistor and the drain electrode of the second NMOS transistor, the constant-voltage element being a diode having an anode connected to the gate electrode of the first NMOS transistor and a cathode connected to the drain electrode of the second NMOS transistor.

The constant-voltage element may be a Zener diode instead of the diode. In this case a cathode of the Zener diode is connected to the gate electrode of the first NMOS transistor and an anode thereof is connected to the drain electrode of the second NMOS transistor.

BRIEF DESCRIPTION OF THE DRAWINGS

The above and other objects, features and advantages of the present invention will be apparent from the following description of preferred embodiments of the invention explained with reference to the accompanying drawings, in which.

DESCRIPTION OF THE PREFERRED EMBODIMENTS

Figure 1:
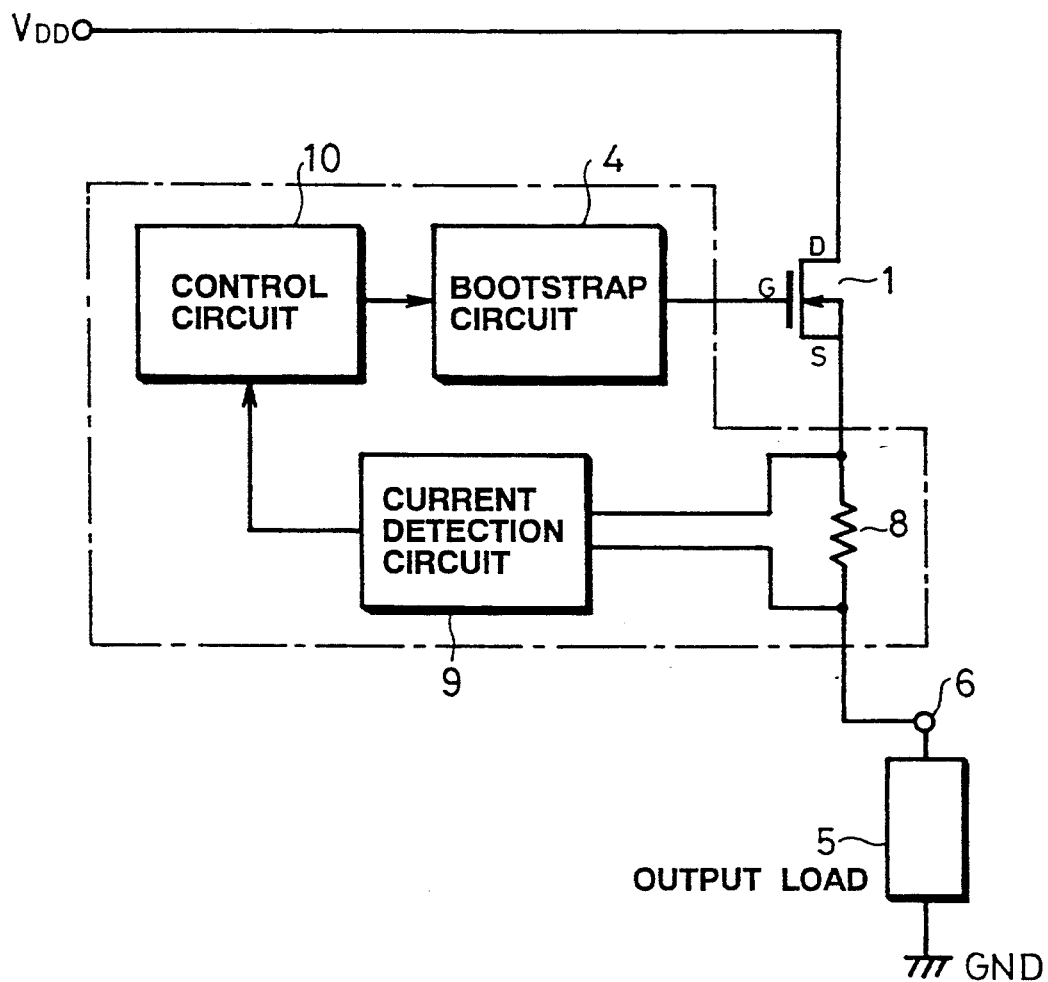
FIG. 1 is a block diagram showing a conventional semiconductor circuit device with the excess current prevention circuit.
Figure 2:
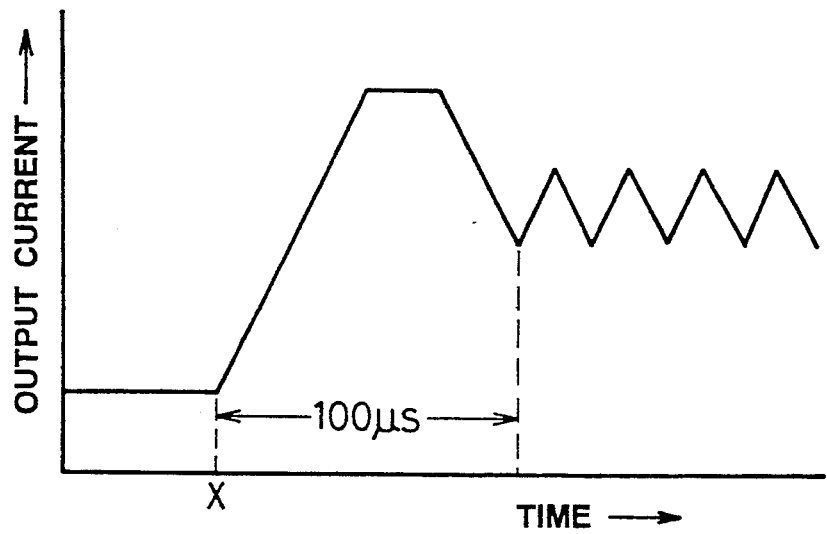
FIG. 2 is a graph showing waveforms of a current flowing in the output transistor in the circuit shown in FIG. 1.
Figure 3:
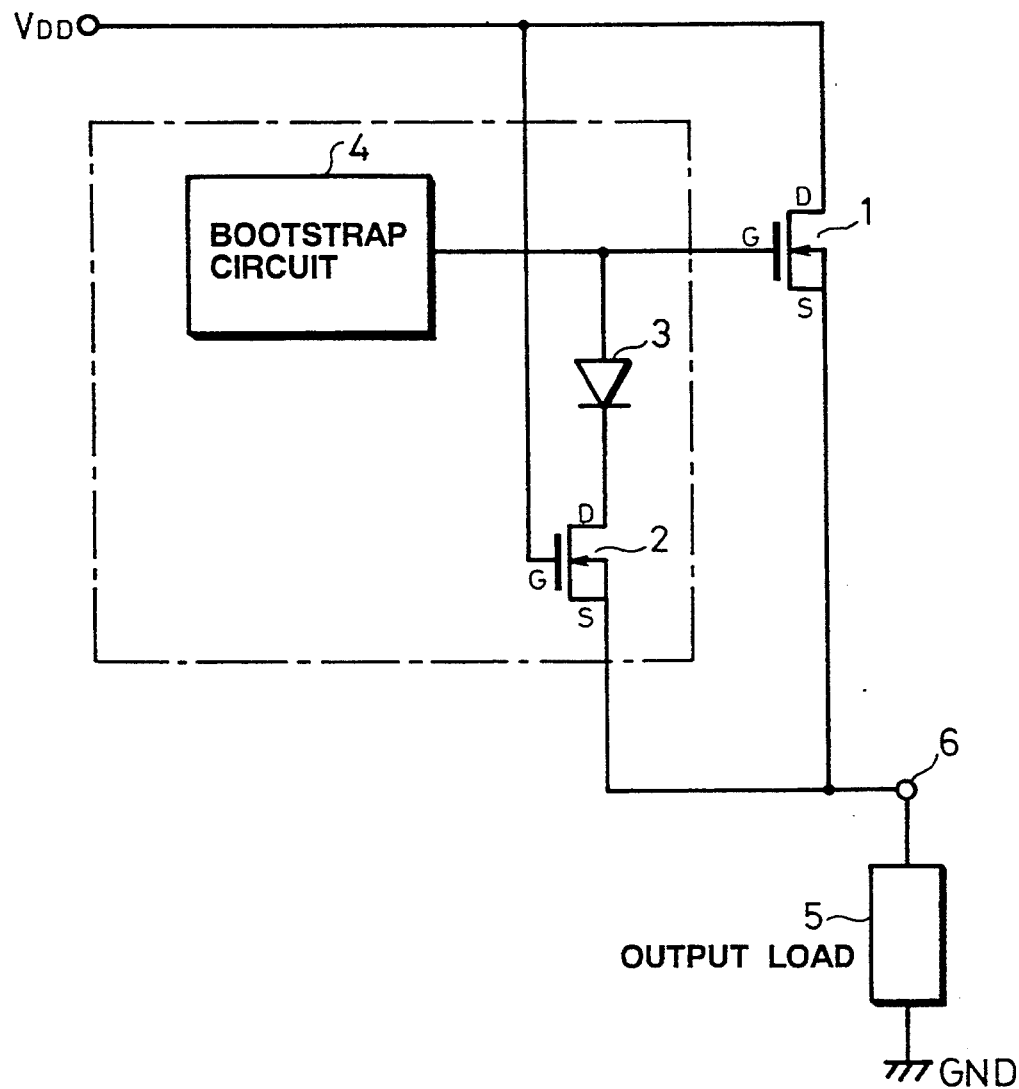
FIG. 3 is a block diagram showing a semiconductor circuit device of a first embodiment according to the invention.

Now, preferred embodiments according to the present invention will be explained with reference to the accompanying drawings in which the same or similar elements with respect to those in the conventional circuit shown in FIG. 1 are represented by the same reference numerals used in the conventional circuit.

FIG. 8 shows, in a block diagram, a first embodiment of a semiconductor circuit device according to the invention.

The semiconductor circuit device of this embodiment is constituted by an output terminal 6; an output load 5; a first NMOS transistor 1 whose drain electrode D is connected to the power supply terminal $V_{DD}$ and whose source electrode is directly connected to the output terminal 6; a second NMOS transistor 2 whose gate electrode is connected to the power supply terminal $V_{DD}$ and whose source electrode is connected to the output terminal 6; a constant-voltage element, that is, a diode 3 whose anode is connected to the gate electrode G of the first NMOS transistor 1 and whose cathode is connected to the drain electrode D of the second NMOS transistor 2; and a bootstrap circuit 4 which is connected to the anode of the diode 3 and the gate electrode G of the first NMOS transistor 1. It should be noted that the semiconductor circuit device of the invention is not provided with an output resistor 8 which is connected between tile source electrode S of the first NMOS transistor 1 and the output terminal 6 in the circuit shown in FIG. 1.

The operation of this circuit device is as follows. Under the normal operation, while the first NMOS transistor 1 which is an output transistor is in a conductive state, the output voltage of the bootstrap circuit 4 has been raised to a voltage at which the first NMOS transistor 1 sufficiently becomes a conductive state.

Where a normal output load 5 is connected between the output terminal 6 and the ground (GND), the output voltage is a potential close to a positive power supply voltage ($V_{DD}$), so that the second NMOS transistor 2 which receives at its gate electrode G the same output voltage takes a non-conductive state and has no effect at all on the overall circuit operation.

Figure 4:
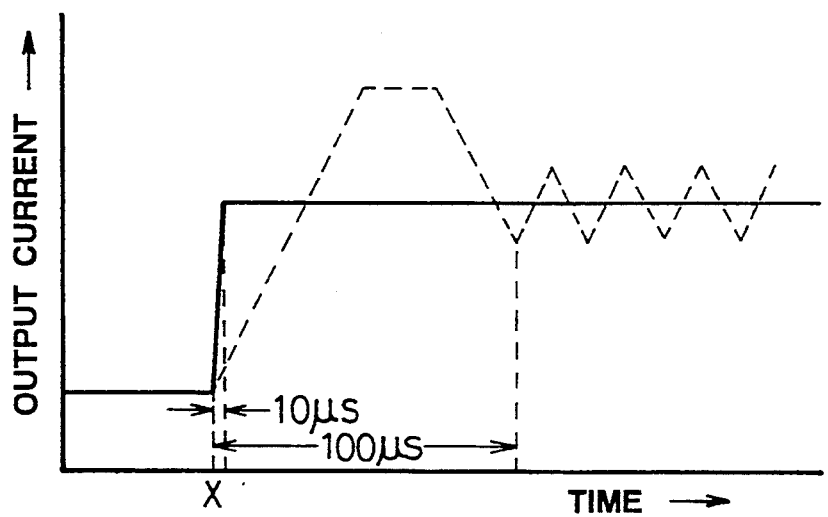
FIG. 4 is a graph showing waveforms of a current flowing in the output transistor in the circuit shown in FIG. 3.

Now, it is assumed that, under the state wherein the first NMOS transistor 1 is in the conductive state, a malfunction has developed in the output load 5 connected to the output terminal 6. For instance, if the output terminal 6 is unintentionally grounded (the output short-circuiting), the voltage at the output terminal 6 is rapidly lowered and the current flowing in the first NMOS transistor 1 increases. Under this state, when the output voltage $V_{OUT}$ at the output terminal 6 becomes lower than the threshold voltage $V_{TH}$ of the second NMOS transistor 2, this NMOS transistor 2 turns to a conductive state and the output voltage $V_{BT}$ (the gate voltage of the first NMOS transistor 1) of the bootstrap circuit 4 is lowered to the voltage represented by the following equation.

$$V_{BT} = V_{TH} + V_{ZD} + V_{OUT},$$

wherein $V_{ZD}$ represents a Zener voltage of the constant-voltage element 3. As a result, as shown in FIG. 4, the current that flows in the first NMOS transistor 1 is limited and controlled to a predetermined constant-current value, whereby the flow of the excess current is prevented.

Figure 5:
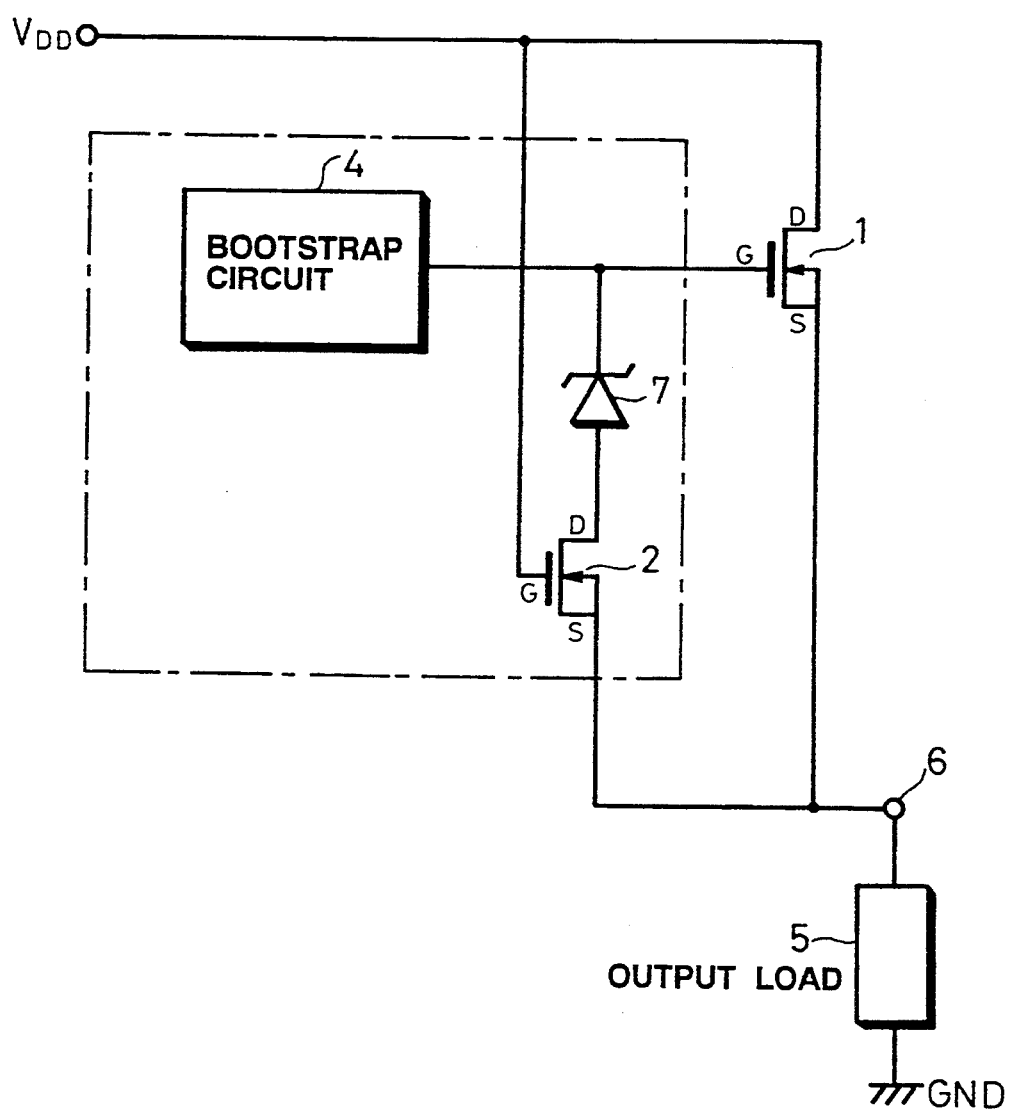
FIG. 5 is a block diagram showing a semiconductor device of a second embodiment according to the invention.

Next, a second embodiment according to the invention is explained with reference to FIG. 5.

The difference from the first embodiment resides in the use of a Zener diode 7 instead of the diode 3 in the first embodiment, for the constant voltage element. The Zener diode 7 has an anode connected to the drain electrode D of the second NMOS transistor 2 and a cathode connected to the gate electrode G of the output first NMOS transistor 1. As in the first embodiment, by lowering the gate voltage of the first NMOS transistor 1 to the voltage that is the sum of the Zener voltage $V_{ZD}$ of the Zener diode 7 and the threshold voltage $V_{TH}$ of the second NMOS transistor 2 and the output voltage $V_{OUT}$, it is made possible to control or limit the current which flows in the first NMOS transistor 1.

Therefore, the voltage between the gate electrode G of the first NMOS transistor 1 and the output terminal 6 can be set to any arbitrary value by the appropriate selection of the Zener voltage of the Zener diode 7. The range of such voltage is a range which does not exceed the voltage in which the threshold voltage $V_{TH}$ of the second NMOS transistor 2 is subtracted from the gate voltage of the first NMOS transistor 1.

The operation of the circuit device of this embodiment is the same as that of the first embodiment and, therefore, the relevant explanation is not repeated here.

Referring back to FIG. 4, by way of comparison between the operation speed for the preventing of the excess current according to this invention (solid line in FIG. 4) versus that in the conventional device (thin dotted line in FIG. 4), the former takes 10 μs (μseconds) until the current is stabilized at a predetermined value and the latter takes 100 μs which means that the present invention has enabled to realize the speeding up of the operation by about 10 times faster as compared with the speed in the conventional device.

As explained above, the semiconductor circuit device according to the present invention adopts, as a means to feedback the changes in the output voltage to the gate of the first NMOS transistor 1, a circuit which is constituted by the combination of the second NMOS transistor 2 and the constant-voltage element such as a diode 3 or a Zener diode 7, and this enables to realize the speeding up of the operation of preventing the excess current by about 10 times faster than the conventional one. Further, along with this speeding up of the operation, it is also possible to prevent the breakdown of the first NMOS transistor 1 as the output transistor and the output load 5. Also, since the circuitry can be made simpler, it is possible to ensure the stable operation and the miniaturization of the chip area of the device.

While the invention has been described in its preferred embodiments, it is to be understood that the words which have been used are words of description rather than limitation and that changes within the purview of the appended claims may be made without departing from the true scope and spirit of the invention in Its broader aspects.

What is claimed is:

1. A semiconductor circuit device with an excess current prevention circuit comprising:
   a bootstrap circuit;
   a first NMOS transistor having a drain electrode connected to a power supply terminal, a gate electrode connected to an output of said bootstrap circuit, and a source electrode connected to an output terminal;
   a second NMOS transistor having a drain electrode, a gate electrode connected to said power supply terminal and a source electrode connected to said output terminal; and
   a constant-voltage element connected between the gate electrode of said first NMOS transistor and the drain electrode of said second NMOS transistor.

2. A semiconductor circuit device according to claim 1, in which said constant-voltage element is a diode whose anode is connected to the gate electrode of said first NMOS transistor and whose cathode is connected to the drain electrode of said second NMOS transistor.

3. A semiconductor circuit device according to claim 1, in which said constant-voltage element is a Zener diode whose cathode is connected to the gate electrode of said first NMOS transistor and whose anode is connected to the drain electrode of said second NMOS transistor.

* * * * *

UNITED STATES PATENT AND TRADEMARK OFFICE
CERTIFICATE OF CORRECTION

PATENT NO. : 5,387,830
DATED : February 7, 1995
INVENTOR(S) : Yoshihiro KUKIMOTO It is certified that errors appears in the above-identified patent and that said Letters Patent is hereby corrected as shown below:

Col. 3, line 3 delete "8", insert --3--

Col. 4, line 52 delete "Its", insert --its--

Signed and Sealed this

Thirteenth Day of June, 1995

Attest:

BRUCE LEHMAN

Attesting Officer       Commissioner of Patents and Trademarks